United States Patent
Narita et al.

(10) Patent No.: US 8,440,941 B2
(45) Date of Patent: May 14, 2013

(54) HEAT TREATMENT APPARATUS, HEAT TREATMENT METHOD AND METHOD FOR MANUFACTURING SEMICONDUCTOR DEVICE

(75) Inventors: Akihiro Narita, Kanagawa (JP); Hideto Ohnuma, Kanagawa (JP); Tomoaki Moriwaka, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/888,627

(22) Filed: Sep. 23, 2010

(65) Prior Publication Data

US 2011/0070692 A1 Mar. 24, 2011

(30) Foreign Application Priority Data

Sep. 24, 2009 (JP) .................. 2009-219305

(51) Int. Cl.
*F27D 11/00* (2006.01)
*B23K 1/005* (2006.01)
*H05B 37/02* (2006.01)
*H01L 21/00* (2006.01)

(52) U.S. Cl.
USPC ........... 219/395; 219/404; 219/405; 392/410; 392/416; 315/152; 315/155; 438/795

(58) Field of Classification Search .................. 219/395, 219/404–406, 410, 428, 470, 476; 392/407, 392/410, 416; 315/152, 155; 438/795
See application file for complete search history.

(56) References Cited

U.S. PATENT DOCUMENTS

| | | | |
|---|---|---|---|
| 4,901,667 A | 2/1990 | Suzuki et al. | |
| 6,159,873 A * | 12/2000 | Takagi | 438/795 |
| 6,537,927 B1 | 3/2003 | Son | |
| 6,727,474 B2 | 4/2004 | Gat | |
| 7,179,729 B2 | 2/2007 | Dairiki et al. | |
| 7,283,734 B2 | 10/2007 | Kubo | |
| 2002/0151154 A1 | 10/2002 | Yamazaki et al. | |
| 2002/0162630 A1 | 11/2002 | Satoh et al. | |
| 2004/0077185 A1 | 4/2004 | Dairiki | |
| 2005/0045274 A1* | 3/2005 | Yanagita et al. | 156/344 |
| 2005/0089597 A1* | 4/2005 | Ito | 425/388 |
| 2005/0115945 A1 | 6/2005 | Kesteren et al. | |

(Continued)

FOREIGN PATENT DOCUMENTS

JP 05-053143 A 3/1993
JP 2003-257882 A 9/2003

(Continued)

*Primary Examiner* — Hsien Ming Lee
(74) *Attorney, Agent, or Firm* — Fish & Richardson P.C.

(57) ABSTRACT

Provided is a heat treatment apparatus in which a large-sized substrate can be rapidly heated and rapidly cooled with high uniformity, and a heat treatment method using the heat treatment apparatus. The heat treatment apparatus includes: a first chamber of which one side is opened; a second chamber of which one side is opened; a device for moving the first and the second chambers; a heating device; a gas introduction port; a gas exhaust port; and a jig for longitudinally fixing a substrate, in which the substrate is rapidly heated while the first and the second chambers are connected, and rapidly cooled by separating the chambers to move the substrate away from a heat storage portion of the heating device or the like. Further, the heat treatment method includes the heat treatment apparatus, and a method for manufacturing a semiconductor device using an oxide semiconductor is included.

19 Claims, 13 Drawing Sheets

| U.S. PATENT DOCUMENTS | | | |
|---|---|---|---|
| 2007/0072439 A1 | 3/2007 | Akimoto et al. | |
| 2007/0117362 A1 | 5/2007 | Dairiki et al. | |
| 2009/0325393 A1* | 12/2009 | Miyoshi et al. | 438/795 |
| 2010/0025678 A1 | 2/2010 | Yamazaki et al. | |
| 2010/0123130 A1 | 5/2010 | Akimoto et al. | |

| FOREIGN PATENT DOCUMENTS | | | |
|---|---|---|---|
| JP | 2003-257882 A | * | 9/2003 |
| JP | 2003257882 A | | 9/2003 |
| JP | 2006-173496 A | | 6/2006 |

* cited by examiner

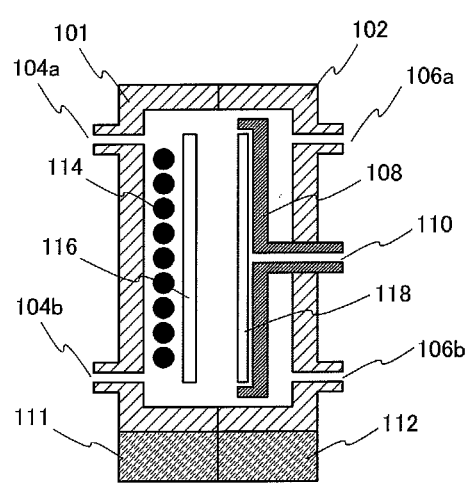
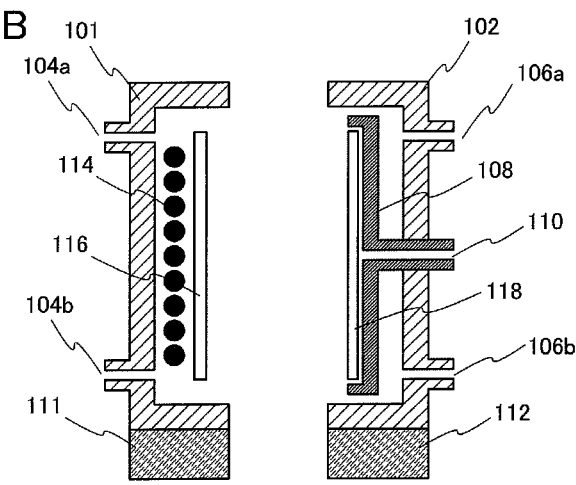

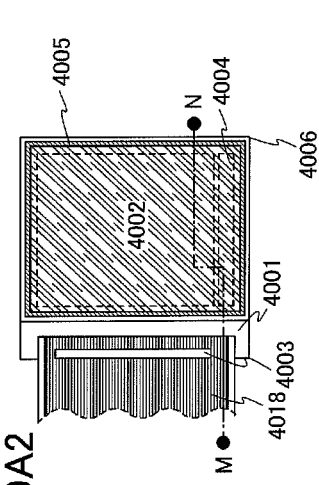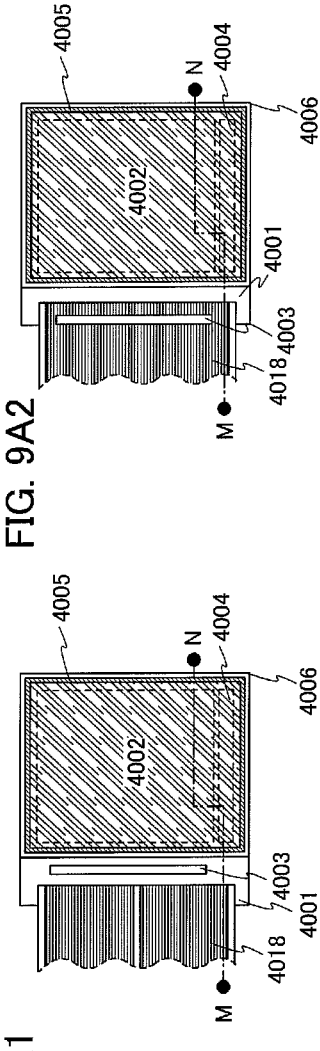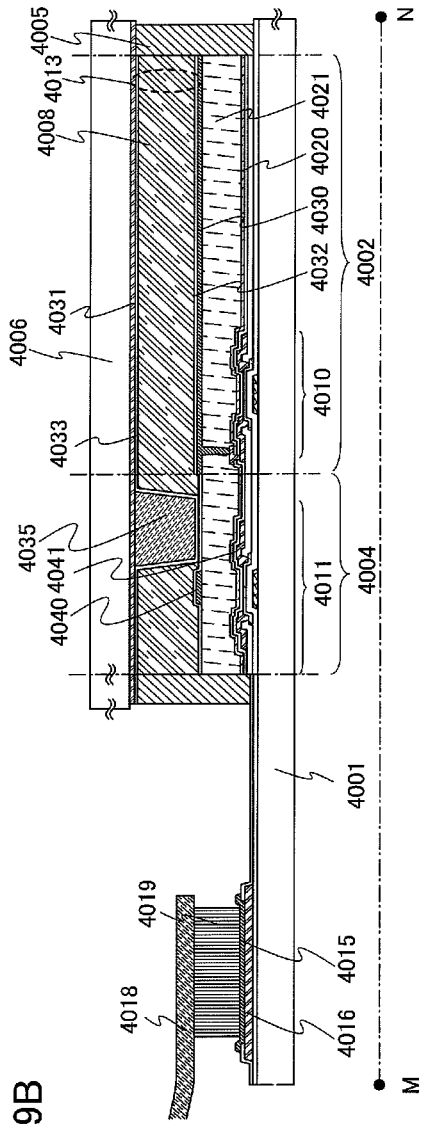

HEAT TREATMENT APPARATUS, HEAT TREATMENT METHOD AND METHOD FOR MANUFACTURING SEMICONDUCTOR DEVICE

BACKGROUND OF THE INVENTION

1. Field of the Invention

The present invention relates to an apparatus for performing heat treatment on a large-sized substrate and a heat treatment method with the use of the apparatus.

In this specification, a semiconductor device means all types of devices which can function by utilizing semiconductor characteristics, and an electro-optical device such as a liquid crystal display device and a light-emitting device, a semiconductor circuit, and an electronic device are all semiconductor devices.

2. Description of the Related Art

In recent years, a technique for forming a transistor using a semiconductor thin film (with a thickness of several to several hundreds of nanometers) has attracted attention. Transistors are widely applied to electronic devices such as an IC and an electro-optical device, and are actively put into production as a switching element for an image display device.

Such a device described above is formed over a large-sized substrate so that a number of panels can be obtained from one substrate. However, in the case of using a glass substrate, there is restriction such that steps which are required to be performed at a temperature higher than or equal to the allowable temperature limit of glass can not be performed.

Therefore, when treatment at a high temperature for a long time is required, a laser annealing method, a rapid thermal annealing (RTA) method, or the like is used (patent document 1).

An RTA method is also referred to as RTP (Rapid Thermal Processing), in which an object to be heated can be rapidly heated and rapidly cooled using a heater or lamp light. Therefore, heat treatment can be performed at a temperature higher than or equal to allowable temperature limit of glass.

Further, because an RTA method does not require a complex optical system used for a laser annealing method, it is a suitable method for treating a comparatively large area uniformly.

REFERENCE

[Patent Document 1] Japanese Published Patent Application No. H05-053143.

SUMMARY OF THE INVENTION

As described above, the RTA method is suitable for heating a comparatively large-area substrate, and application of the RTA method for a larger-area substrate is desired. A large-area substrate is easy to bend because of its thinness and its own weight, and therefore, a plurality of supporting members is necessary. In order to heat the substrate with high uniformity in a short time, a supporting method is desired in which heat conduction from a supported point of the substrate is suppressed as much as possible. Further, an apparatus preferably has a structure where increase in heat capacity due to increase in size of the apparatus does not interfere with the action of rapid heating and rapid cooling.

Therefore, it is an object of an embodiment of the present invention to provide a heat treatment apparatus in which a large-area substrate is rapidly heated and rapidly cooled with high uniformity. Another object is to provide a heat treatment method using the heat treatment apparatus. Furthermore, it is still another object to provide a method for manufacturing a semiconductor device having favorable electric characteristics and high reliability with the use of the heat treatment apparatus.

An embodiment of the present invention disclosed in this specification is a heat treatment apparatus which can be applied to a large-area substrate, and is capable of rapid heating and rapid cooling with high uniformity. Further, an embodiment of the present invention is a heat treatment method using the heat treatment apparatus, and includes a method for manufacturing a semiconductor device in which an oxide semiconductor is used.

An embodiment of the present invention disclosed in this specification is a heat treatment apparatus including a first chamber of which one side is opened; a second chamber of which one side is opened; a device for moving the first chamber and the second chamber; a heating device; a gas introduction port; a gas exhaust port; and a fixing jig of a substrate.

Furthermore, another embodiment of the present invention disclosed in this specification is a heat treatment apparatus in which the above-mentioned structure is installed in a third chamber with an opening and closing apparatus.

Note that the ordinal numbers such as "first" and "second" in this specification are used for convenience and do not denote the order of steps or the stacking order of layers. In addition, the ordinal numbers in this specification do not denote particular names which specify the present invention.

The first chamber and the second chamber each have a box shape in which one side of the side surfaces is opened and the open sides of the first chamber and the second chamber are connected to form a chamber.

The heating device includes a resistance heater, a lamp heater, or a unit using a heated gas, and is provided for one of or both of the first chamber and the second chamber.

As a means for controlling an atmosphere, a gas introduction port and a gas exhaust port are provided. An exhausted process gas can be regenerated in a gas refining apparatus connected to the gas exhaust port.

A substrate that is an object to be heated is installed longitudinally in a fixing jig of the substrate. As the manner of installation, a non-contact Bernoulli Chuck or a method for holding a substrate while part of end portions thereof is pinched can be used. Further, a structure may be used, in which a substrate is held by being inclined from the perpendicular position with respect to the bottom of the device. With the use of a jig used in a method for holding a substrate with part of end portions thereof pinched, a plurality of substrates can be held in a stack with intervals between substrates.

In the case where the third chamber is provided, the opening and closing apparatus serves as a carry-in-and-out port of the substrate, and a load and unload chamber can also be provided. With this structure, adsorption of impurities and the like due to reduction in time for replacement of gases and atmospheric exposure of the substrate under a high temperature condition can be suppressed.

Further, another embodiment of the present invention disclosed in this specification is a heat treatment method in which a substrate is installed in a fixing jig; one side of the first chamber which is opened and one side of the second chamber which is opened are disposed to face each other so as to form a connected chamber to confine the substrate; an atmosphere in the connected chamber is replaced with an inert gas; the substrate is rapidly heated using a heating device; and the connected chamber is separated into the first chamber and the second chamber to be opened so that the substrate is rapidly cooled.

First, the first chamber and the second chamber are separately fixed such that the open sides of the first chamber and the second chamber face each other, and the substrate is installed longitudinally in a fixing jig.

Next, the first chamber and the second chamber are moved to be connected to each other or connected with a fixing jig sandwiched between the first chamber and the second chamber so that one chamber is formed. Here, the substrate is hermetically confined in the connected chamber, and placed in a position to be heated efficiently.

Next, an atmosphere in the connected chamber is replaced with an inert gas. For the inert gas, nitrogen, helium, neon, argon, or the like can be used.

Then, rapid heating is performed using the heating device, and heating is performed for the process time which is set in advance. Then, the heating device is stopped and the connected chamber is separated into the first chamber and the second chamber to be opened, whereby the substrate is rapidly cooled. Through the above described steps, rapid heating and rapid cooling of the substrate can be performed.

Another embodiment of the present invention disclosed in this specification is a method for manufacturing a semiconductor device comprising the steps of: forming a gate electrode layer over a substrate; forming a gate insulating layer over the gate electrode layer; forming an oxide semiconductor layer over the gate insulating layer; setting a substrate over which the oxide semiconductor layer is formed in a fixing jig; disposing one side of the first chamber which is opened and one side of the second chamber which is opened to face each other so as to form a connected chamber to confine the substrate; replacing an atmosphere in the connected chamber with an inert gas; heating the substrate rapidly with the use of a heating device; separating the connected chamber into the first chamber and the second chamber to be opened and cooling the substrate so that dehydration or dehydrogenation of the oxide semiconductor layer is performed; forming a source electrode layer and a drain electrode layer over the oxide semiconductor layer; and forming an oxide insulating layer in contact with the oxide semiconductor layer.

In order to reduce impurities such as moisture in the oxide semiconductor layer, the oxide semiconductor layer is subjected to heat treatment in an atmosphere of an inert gas such as nitrogen, helium, or argon so that dehydration or dehydrogenation is performed. At this time, a dew point of the inert gas is preferably lower than or equal to −50° C., more preferably, lower than or equal to −60° C. The semiconductor device including an oxide semiconductor film in which moisture contained in the film is reduced by dehydration or dehydrogenation can achieve favorable electric characteristics and high reliability.

Further, with the use of a method for manufacturing a semiconductor device according to an embodiment of the present invention, a driver circuit portion and a display portion (also referred to as a pixel portion) can be formed over one substrate and a display device can be manufactured using an EL element, a liquid crystal element, an electrophoretic element, or the like.

Note that in this specification, a "chamber" has a box shape which can be confined or forms a space which is hermetically confined, and for example, indicates a polyhedron that has a space inside, such as a cube and a rectangular solid. However, if a space is formed inside, the chamber may have a spherical shape, or may include a projected portion, or a depressed portion.

One or more of the following can be provided: a heat treatment apparatus in which a large-area substrate is rapidly heated and rapidly cooled with high uniformity; a heat treatment method using the heat treatment apparatus; and a method for manufacturing a highly reliable semiconductor device with favorable characteristics in which the heat treatment apparatus is used.

BRIEF DESCRIPTION OF THE DRAWINGS

FIGS. 1A and 1B are cross-sectional views of a heat treatment apparatus of an embodiment of the present invention.

FIGS. 9A1 and 9A2 are plane views illustrating a semiconductor device and

FIG. 9B is a cross-sectional view illustrating a semiconductor device.

DETAILED DESCRIPTION OF THE INVENTION

Figure 2A:
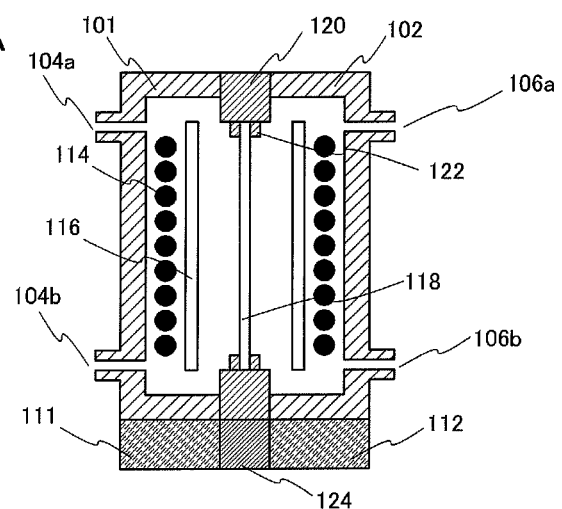
FIGS. 2A and 2B are cross-sectional views of a heat treatment apparatus of an embodiment of the present invention.

Hereinafter, embodiments of the present invention will be described in detail with reference to the accompanying drawings. However, the present invention is not limited to the description below and it is easily understood by those skilled in the art that the modes and details can be changed variously. Therefore, the present invention is not construed as being limited to description of the embodiments. Note that in the drawings of this specification, the identical portions or portions having a similar function are denoted by the identical reference numerals, and description thereon may be omitted.

Embodiment 1

In this embodiment, a structure of heat treatment apparatus and a heat treatment method will be described with reference to drawings. FIG. 1A illustrates an example of a cross-sectional structure of a heat treatment apparatus.

FIG. 1A is a cross-sectional view illustrating a state of heating a substrate 118 which is installed in the heat treatment apparatus. In the structure of the apparatus, a first chamber 101 and a second chamber 102 each have a box shape in which one side of side surfaces is opened, and the open sides are connected to form a chamber. Moving devices 111 and 112 for moving each chamber are provided in lower parts of the first chamber 101 and the second chamber 102, respectively. However, one chamber may be fixed and only the other may be provided with the moving device.

The substrate 118 is held longitudinally in a non-contact manner by a Bernoulli Chuck 108 provided in the second chamber 102. "Bernoulli Chuck" is a holding method utilizing Bernoulli's principle, for holding a substrate in a non-contact manner with the use of a negative pressure generated in the vicinity of the substrate by blowing a gas to the substrate at high velocity. By holding the substrate in a non-contact manner, heat conduction to the contacted portion can be prevented and uniformity of temperature distribution on a substrate surface can be improved.

A gas introduction port 110 is provided for the Bernoulli Chuck 108, and a gas for holding the substrate 118 is introduced from the gas introduction port 110. At this time, when the gas heated at high temperature is used, preheating of the substrate 118 can be performed and rapid heating of the substrate at higher temperature can be promoted. On the contrast, when the gas at normal temperature or low temperature is used, rapid cooling of the substrate 118 can be promoted.

A heating device 114 provided in the first chamber 101 has a cross section of a rod-like heating unit and placed parallel to the substrate 118 with a quartz window 116 interposed between the heating device 114 and the substrate 118. As the rod-like heating unit, a resistance heater or a lamp heater can be used. The resistance heater includes the one using induction heating. Further, it is preferable that a lamp emit light of which center wavelength is in the infrared region. The quartz window 116 is provided for protection of the heating device 114 and the substrate 118; however it can be omitted. Furthermore, when the heated gas which is described above is used, the Bernoulli Chuck 108 is included in one of the heating devices. Note that the entire substrate can be heated uniformly because a shutter is not provided between the heating device 114 and the substrate 118.

Figure 3A:
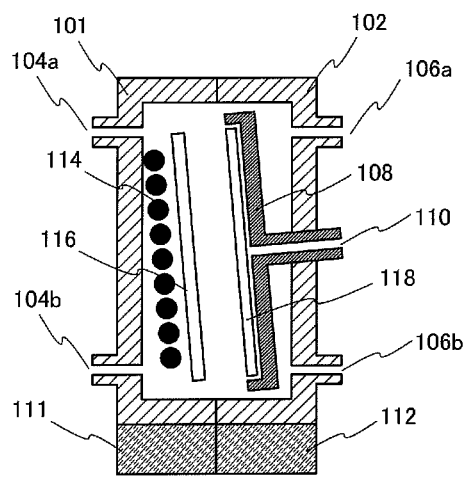
FIGS. 3A and 3B are cross-sectional views of a heat treatment apparatus of an embodiment of the present invention.

As in FIG. 3A, the Bernoulli Chuck 108 may be placed obliquely. The angle at which the Bernoulli Chuck 108 is inclined from the perpendicular position with respect to the bottom of the device is preferably higher than or equal to $-30°$ and lower than or equal to $+30°$, more preferably, higher than or equal to $-10°$ and lower than or equal to $+10°$. Note that FIG. 3A illustrates the case where the Bernoulli Chunk 108 is inclined in the minus direction. By setting the substrate obliquely, the size in height direction of the device can be reduced. In addition, bending of the substrate when the substrate is transferred and attachment of a particle are easily controlled. Note that the heating device 114 is placed to be inclined at the same angle as the substrate 118 so as to be parallel to the substrate 118.

As a means for controlling the atmosphere, gas introduction ports 104a and 104b, and gas exhaust ports 106a and 106b are provided. The gas introduction ports 104a and 104b are ports for introducing a replacement gas (inert gas) when heating is performed and the gas exhaust ports 106a and 106b are ports for exhausting the air when replacement is performed and for exhausting the extra replacement gas also in the process. Although not illustrated in the drawing, the gas exhaust ports 106a and 106b are connected to a gas refining apparatus, and the exhausted replacement gas can be regenerated in the gas refining apparatus. In FIG. 1A, two gas introduction ports and two gas exhaust ports are illustrated; however, the number of the gas introduction ports and gas exhaust ports may be one or greater than equal to three. The position thereof is not limited.

As a large amount of a gas used when the substrate is heated, an inert gas which is the same as the gas used for the replacement of the atmosphere in the chamber is used, and the inert gas which is exhausted is regenerated in the gas refining apparatus and can be reused.

FIG. 2A illustrates a cross-sectional structure of a heat treatment apparatus that is a different embodiment from FIG. 1A.

The heat treatment apparatus in FIG. 2A includes the first chamber 101 and the second chamber 102. The first chamber 101 and the second chamber 102 each have a box shape in which one side of the side surfaces is opened, and the open sides are connected to form a chamber. Here, the first chamber 101 and the second chamber 102 are connected with a fixing jig 120 of a substrate interposed therebetween; however, the whole of the fixing jig 120 of a substrate may be included in a chamber that is formed by directly connecting the first chamber 101 and the second chamber 102.

The fixing jig 120 of the substrate is provided with a holding jig 122 which holds the substrate 118 with part of end portions thereof pinched, and part of the end portions of the substrate is fixed. In FIG. 2A, two holding jigs 122 are illustrated in an upper portion and a lower portion. It is preferable that the substrate 118 be held at a plurality of portions so that the contact area between the substrate 118 and the holding jigs is reduced. Not only upper and lower portions of the substrate but also side portions of the substrate may be held. The end portions of the substrate 118 which are in contact with the holding jig 122 are less temperature uniformity on a substrate surface because of heat conduction to the holding jigs; however, it is not an effective area on the substrate surface, whereby uniformity of temperature distribution is not obstructed.

Figure 3B:
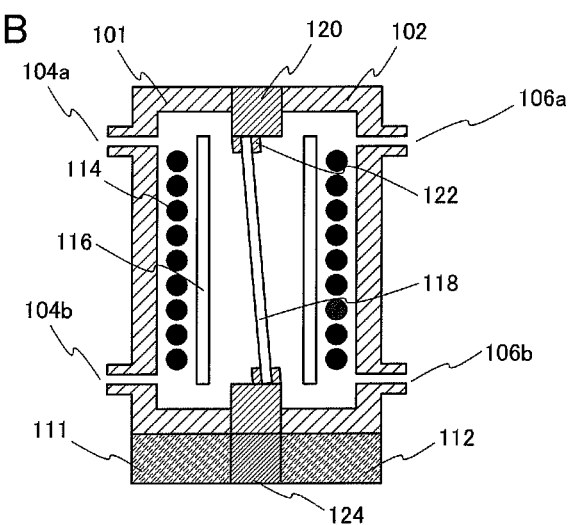

As in FIG. 3B, the substrate 118 may be placed obliquely. The angle at which the substrate 118 is inclined from the perpendicular position with respect to the bottom of the device is preferably higher than or equal to $-30°$ and lower than or equal to $+30°$, more preferably, higher than or equal to $-10°$ and lower than or equal to $+10°$. Note that FIG. 3B illustrates the case where the substrate 118 is inclined in the minus direction. By setting the substrate obliquely, the size in the height direction of the device can be reduced. In addition, bending of the substrate when the substrate is transferred and attachment of a particle are easily controlled. Of course, the heating device 114 may be inclined so as to be parallel to the substrate 118.

Figure 4A:
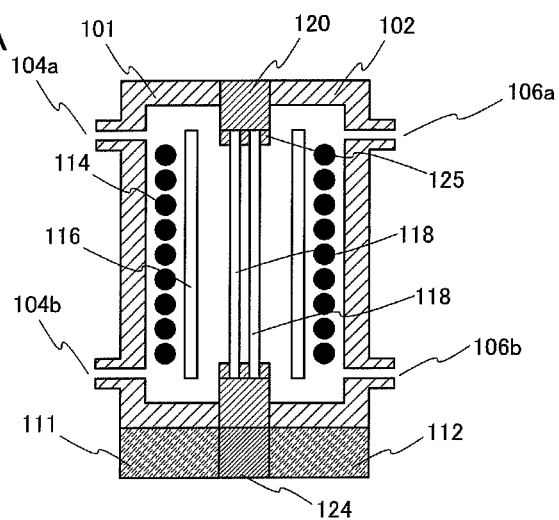
FIGS. 4A and 4B are cross-sectional views of a heat treatment apparatus of an embodiment of the present invention.

Further, by changing the holding jig 122 to a holding jig 125 of the substrate, a plurality of substrates can be subjected to heat treatment at the same time (see FIG. 4A). In this heat treatment apparatus, a substrate is heated from both sides. In the case where at least two substrates are placed, the same heat treatment process can be performed on the two substrates at the same time, that is, batch processing is possible. It is needless to say that processing can be performed with the substrates placed obliquely as described above.

Moving devices 111, 112, and 124 for moving each chamber are provided in the lower part of the first chamber 101, the second chamber 102, and the fixing jig 120, respectively. Note that, one chamber may be fixed and the other chamber may be provided with the moving device.

The heating device 114 is provided for both the first chamber 101 and the second chamber 102. The heating device 114 has a cross section of a rod-like heating unit and placed parallel to the substrate 118 with the quartz window 116 interposed therebetween. As the rod-like heating unit, a resistance heater or a lamp heater can be used. The resistance heater includes the one using induction heating. Further, it is preferable that a lamp emit light of which center wavelength is in the infrared region. The quartz window 116 is provided for protection of the heating device 114 and the substrate 118. However, it can be omitted. Note that the entire surfaces of the substrate can be heated uniformly because a shutter is not provided between the heating device 114 and the substrate 118.

As a means for controlling the atmosphere, the gas introduction ports 104a and 104b, and the gas exhaust ports 106a and 106b are provided. The action and the condition are the same as those described with reference to FIG. 1A.

Figure 2B:
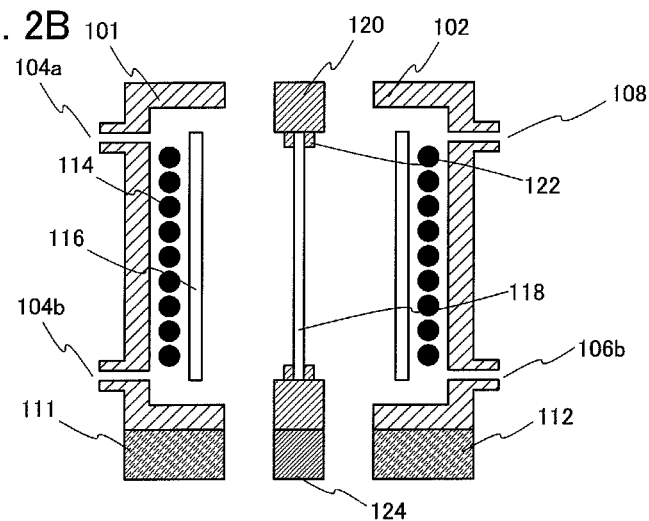
Figure 4B:
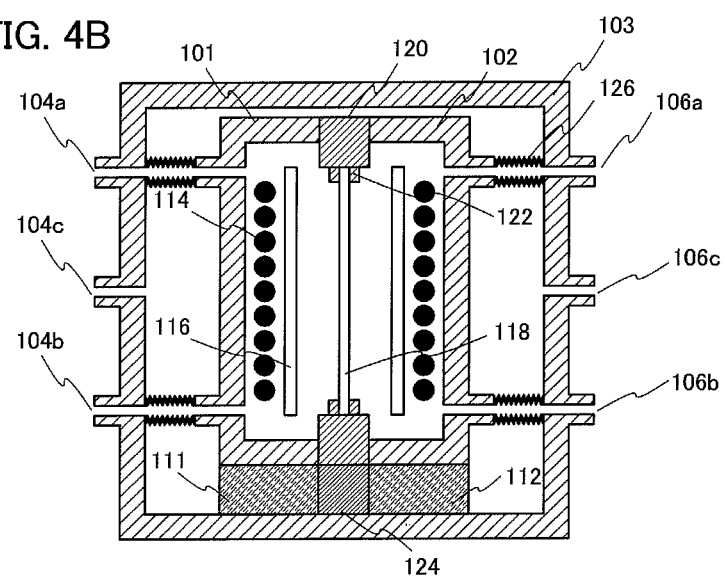

Each of the modes illustrated in FIG. 1A and FIG. 2A can be put in the third chamber in which the atmosphere is controlled. As one example, a structure in which the heat treatment apparatus described with reference to FIGS. 2A and 2B is placed in a third chamber 103 is illustrated in FIG. 4B. In the third chamber 103, the first chamber 101, the second chamber 102, the fixing jig 120 of the substrate, and the respective moving devices 111, 112, and 124 are placed, and the gas introduction ports and gas exhaust ports are drawn to the third chamber through flexible pipes 126. FIG. 4B is a state when heating is performed, and when cooling is performed, rapidly cooling can be performed without exposure to the air because the first chamber 101 and the second chamber 102 are separated in the third chamber 103 in which the atmosphere is controlled. When the atmosphere in the third chamber 103 is controlled, the heating device 114 is operated in advance and the substrate can be preheated or rapidly heated with stable output because replacement of gases is not necessary after connecting the first chamber 101 and the second chamber 102. Although not illustrated in the drawing, the third chamber can be a tunnel-type provided with opening and closing apparatus that serves as a carry-in-and-out port of the substrate in the depth direction of FIG. 4B, and a load and unload chamber can also be provided. With this structure, adsorption of impurities and the like due to reduction in time for replacement of gases and atmospheric exposure of the substrate under a high temperature condition can be suppressed.

Next, a heat treatment method using the heat treatment apparatus illustrated in FIGS. 1A and 1B is described.

First, the first chamber 101 and the second chamber 102 are separately fixed such that the open sides of the first chamber 101 and the second chamber 102 face each other, and the substrate 118 is installed in the Bernoulli Chuck 108. The installation in the Bernoulli Chuck 108 is performed by a single wafer manner using a transfer arm robot (see FIG. 1B).

A current of air is necessary for the installation of the substrate 118 to the Bernoulli Chuck 108, and a gas is introduced from the gas introduction port 110. At this time, the substrate is exposed to the air, and the gas to be used is preferably inexpensive dry air or nitrogen. However, in the case where the third chamber in which the atmosphere is controlled is provided, a replacement gas described below may be used.

Subsequently, the first chamber 101 and the second chamber 102 move and are connected to each other to form one chamber. Here, the substrate 118 is hermetically confined in the connected chamber, and placed in a position where the substrate 118 is heated efficiently (see FIG. 1A).

Next, the replacement gas is introduced into the connected chamber through the gas introduction ports 104a and 104b, and gas is replaced. At this time, an inert gas such as nitrogen, helium, neon, or argon can be used as the replacement gas. Specifically, helium has favorable thermal conductance; thus, further improvement in the rapid heating and rapid cooling is expected. Furthermore, the gas supplied to the Bernoulli Chuck 108 is changed to the replacement gas. At this time, a positive pressure is obtained within the chamber, and extra replacement gas is exhausted from the gas exhaust ports 106a and 106b, whereby the pressure in the chamber can be kept constant. The exhausted replacement gas is regenerated in the gas refining apparatus and can be reused. Further, by using the heated replacement gas, the substrate can be preheated.

Next, rapid heating is performed using the heating device 114, and heating is performed for the process time which is set in advance. The heating device 114 and the introduction of the replacement gas are stopped; the moving devices 111 and 112 are operated as illustrated in FIG. 1B; the connected chamber is separated into the first chamber 101 and the second chamber 102 to be opened, whereby the substrate is rapidly cooled. Through the above described steps, rapid heating and rapid cooling of the substrate can be performed.

Here, it is a feature of an embodiment of the present invention to separate the chamber to move the substrate away from a heat storage portion of the heating device or the like in order to rapidly cool the substrate using temperature difference between inside and outside the chamber. In the case where the chamber is not separated, residual heat last until the substrate is carried out. Accordingly, it becomes difficult to control the heating process, and problems such as shrinks of the substrate are likely to occur. Specifically, because a large-sized apparatus has high heat capacity, the influence is remarkable. By using the heat treatment apparatus and heat treatment method of this embodiment, shrinkage percentage can be suppressed to less than or equal to 20 ppm even in the case where heat treatment is performed on a large glass substrate at a temperature higher than the strain point of the glass substrate. For example, in the case where a glass substrate with a size of 600 mm×720 mm is used, shrinkage percentage from the center to the end of the substrate can be suppressed up to approximately 7 μm.

Next, a heat treatment method using the heat treatment apparatus illustrated in FIGS. 2A and 2B is described.

First, the first chamber 101 and the second chamber 102 are separately fixed such that the open sides of the first chamber 101 and the second chamber 102 face each other, and the substrate 118 is installed in the fixing jig 120 using a transfer arm robot and carried between the first chamber 101 and the second chamber 102 by the moving device (see FIG. 2B).

Subsequently, the first chamber 101 and the second chamber 102 move with the use of the moving devices 111 and 112 and form a chamber in which the first chamber 101 and the second chamber 102 are connected with the fixing jig 120 interposed therebetween. Here, the substrate 118 is hermetically confined in the connected chamber, and placed in a position to be heated efficiently (see FIG. 2B).

Next, the replacement gas is introduced into the connected chamber through the gas introduction ports 104a and 104b and gas is replaced. At this time, an inert gas such as nitrogen, helium, neon, or argon can be used as the replacement gas. Specifically, helium has favorable thermal conductance; thus, further improvement in the rapid heating and rapid cooling is expected. At this time, a positive pressure is obtained within the chamber, and extra replacement gas is exhausted from the gas exhaust ports 106a and 106b, whereby the pressure in the chamber can be kept constant. The replacement gas which is exhausted is regenerated in the gas refining apparatus and can be reused. Further, before introducing the replacement gas into the chamber, vacuuming may be performed once.

Next, rapid heating is performed using the heating device 114, and heating is performed for the process time which is set in advance. Subsequent steps are similar to those described with reference to FIGS. 1A and 1B.

As described above, a heat treatment apparatus in which a large-sized substrate can be rapidly heated and rapidly cooled with high uniformity, and a heat treatment method in which the heat treatment apparatus is used can be provided.

Note that this embodiment can be freely combined with any of the other embodiments.

Embodiment 2

In this embodiment, an embodiment of a transistor and a manufacturing method thereof will be described with reference to FIGS. 5A to 5E. FIG. 5E illustrates an example of a cross-sectional structure of a transistor.

A transistor 440 illustrated in FIG. 5E has a bottom-gate structure called a channel-etched structure. Note that in this embodiment, the transistor has a bottom-gate structure as an example; however, the invention is not limited thereto, and the transistor may have a top-gate structure.

The transistor 440 is formed over a substrate 400 having an insulating surface, and includes a gate electrode layer 421a, a gate insulating layer 402, an oxide semiconductor layer including a channel formation region 443, a source electrode layer 445a, and a drain electrode layer 445b. In addition, an insulating layer 427 and a protective insulating layer 428 are provided over the channel formation region 443, the source electrode layer 445a, and the drain electrode layer 445b.

A first region 444c and a second region 444d of the oxide semiconductor layer, each of which overlaps with an oxide insulating layer 426, may be provided in an oxygen-excess state like the channel formation region 443 so as to have a function of reducing leak current and parasitic capacitance. Note that the transistor 440 may have a structure in which the oxide insulating layer 426 is not formed.

A process of manufacturing the transistor 440 is described below with reference to FIGS. 5A to 5E.

First, after a conductive film is formed over the substrate 400 having an insulating surface, the gate electrode layer 421a is formed by a first photolithography step and an etching step.

Note that a resist mask used for the photolithography step may be formed by an ink-jet method in this embodiment. When the resist mask is formed by an ink-jet method, manufacturing costs can be reduced because a photomask is not used.

As a material of the conductive film of the gate electrode layer 421a, an element selected from Al, Cr, Ta, Ti, Mo, and W, an alloy including the above element, an alloy in which any of the above-described elements are combined, and the like can be given. Alternatively, an oxide conductive film may be used.

As the substrate 400, it is preferable to use a glass substrate whose strain point is higher than or equal to 730° C. in the case where the temperature at which heat treatment is performed later is high. For example, a glass material such as aluminosilicate glass, aluminoborosilicate glass, or barium borosilicate glass can be used. Note that by containing more barium oxide (BaO) than boric oxide, a more practical heat-resistant glass substrate can be generally obtained. Therefore, a glass substrate containing a larger amount of BaO than $B_2O_3$ is preferably used.

Note that, instead of the glass substrate described above, a substrate formed using an insulator, such as a ceramic substrate, a quartz substrate, or a sapphire substrate, may be used as the substrate 400. Alternatively, crystallized glass or the like may be used.

An insulating layer serving as a base film may be provided between the substrate 400 and the gate electrode layer 421a. The base film has a function of preventing diffusion of an impurity element from the substrate 400, and can be formed using a single-layer structure or a stacked structure of one or more of a silicon nitride film, a silicon oxide film, a silicon nitride oxide film, and a silicon oxynitride film.

Next, the gate insulating layer 402 is formed over the gate electrode layer 421a.

The gate insulating layer 402 can be formed using an insulating film such as a silicon oxide film, a silicon nitride film, a silicon oxynitride film, or a silicon nitride oxide film with a plasma CVD method, a sputtering method, or the like. The gate insulating layer 402 is not limited to a single layer, and a stacked layer of the plurality of insulating films as mentioned above may also be used. For example, a silicon oxynitride film can be formed with a plasma CVD method using silane ($SiH_4$), oxygen, and nitrogen as a film formation gas. The thickness of the gate insulating layer 402 is 100 nm to 500 nm inclusive. In the case of a stacked structure, for example, a first gate insulating layer having a thickness of 50 nm to 200 nm inclusive and a second gate insulating layer having a thickness of 5 nm to 300 nm are stacked in this order.

In this embodiment, the gate insulating layer 402 is formed using a silicon oxynitride (SiON (composition ratio: N<O)) film having a thickness of 100 nm formed with a plasma CVD method.

Figure 5A:
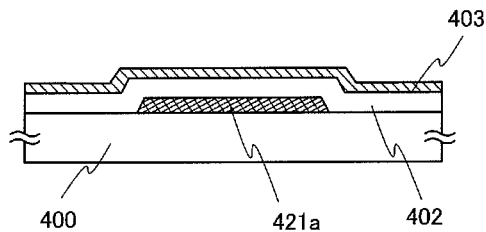
FIGS. 5A to 5E are process cross-sectional views of a semiconductor device of an embodiment of the present invention.
Figure 5B:
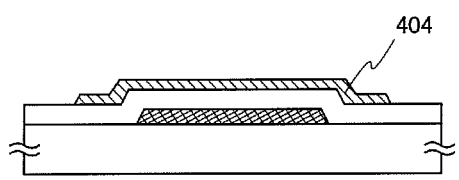
Figure 5C:
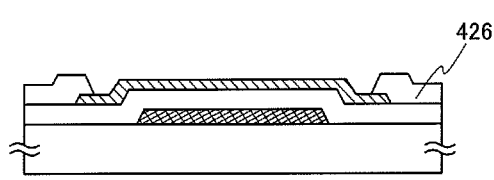
Figure 5D:
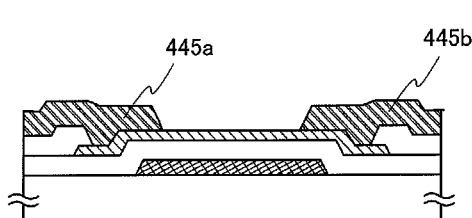
Figure 5E:
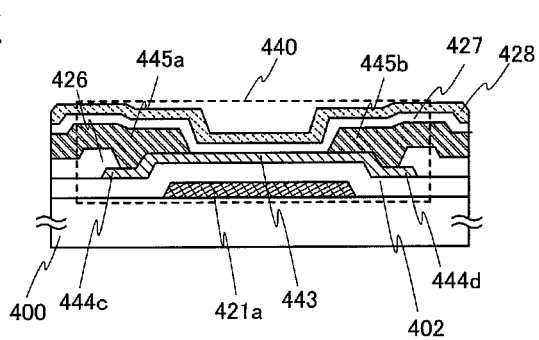

Next, over the gate insulating layer 402, an oxide semiconductor film 403 is formed to a thickness of 5 nm to 200 nm inclusive, preferably, 10 nm to 20 nm inclusive (see FIG. 5A).

As the oxide semiconductor film 403, a four-component metal oxide such as an In—Sn—Ga—Zn—O-based film, a three-component metal oxide such as an In—Ga—Zn—O-based film, an In—Sn—Zn—O-based film, an In—Al—Zn—O-based film, a Sn—Ga—Zn—O-based film, an Al—Ga—Zn—O-based film, and a Sn—Al—Zn—O-based film, or a two-component metal oxide such as an In—Zn—O-based film, a Sn—Zn—O-based film, an Al—Zn—O-based film, a Zn—Mg—O-based film, a Sn—Mg—O-based film, an In—Mg—O-based film, an In—O-based film, a Sn—O-based film, and a Zn—O-based film can be used. The above oxide semiconductor film may include $SiO_2$.

As the oxide semiconductor film 403, a thin film expressed by $InMO_3(ZnO)_m$ (m>0) can be used. Here, M represents one or more metal elements selected from Ga, Al, Mn, and Co. For example, Ga, Ga and Al, Ga and Mn, or Ga and Co can be given as M. An oxide semiconductor film whose composition formula is represented as $InMO_3(ZnO)_m$ (m>0) where at least Ga is included as M is referred to as the In—Ga—Zn—O-based oxide semiconductor described above, and a thin film thereof is also referred to as an In—Ga—Zn—O-based film.

The oxide semiconductor film 403 can be formed using a metal oxide target including In, Ga, and Zn ($In_2O_3:Ga_2O_3:ZnO=1:1:1$ [in a molar ratio], and $In_2O_3:Ga_2O_3:ZnO=1:1:2$ [in a molar ratio]) under the following conditions: the distance between a substrate and a target is 100 mm; the pressure is 0.6 Pa; the direct-current (DC) power supply is 0.5 kW; and the atmosphere is oxygen (the flow rate of oxygen is 100%). It is preferable that a pulsed direct-current (DC) power supply be used because powder substances (also referred to as particles or dust) generated in film formation can be reduced and the film thickness can be uniform. In this embodiment, as the oxide semiconductor film 403, a 15-nm-thick In—Ga—Zn—O-based oxide semiconductor film is formed by a sputtering method using an In—Ga—Zn—O-based metal oxide target.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case where an insulating layer is formed, and a DC sputtering method is mainly used in the case where a conductive film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used instead of using glow discharge.

Furthermore, as a film-formation method by sputtering, there are also a reactive sputtering method in which a target substance and a sputtering gas component are chemically reacted with each other during film-formation to form a thin compound film thereof, and a bias sputtering in which a voltage is also applied to a substrate during film-formation.

Note that before the oxide semiconductor film 403 is formed with a sputtering method, dust on a surface of the gate insulating layer 402 is preferably removed by reverse sputtering in which an argon gas is introduced and plasma is generated. The reverse sputtering refers to a method in which a surface of a substrate is modified in such a manner that an RF power source for voltage application is used to a substrate side under an argon atmosphere and ionized argon is collided with the substrate. Note that nitrogen, helium, oxygen, or the like may be used instead of argon.

Before the oxide semiconductor film 403 is formed, heat treatment (at higher than or equal to 400° C. and lower than the strain point of the substrate) may be performed under an atmosphere of an inert gas (e.g., nitrogen, helium, neon, or argon) so that impurities such as hydrogen and water, which are included in the gate insulating layer 402, are removed.

Then, the oxide semiconductor film 403 is processed into island-shaped oxide semiconductor layer 404 by a second photolithography step and an etching step.

Next, the oxide semiconductor layer 404 is subjected to dehydration or dehydrogenation. First heat treatment for the dehydration or dehydrogenation can be performed through rapid thermal annealing (RTA) treatment under an atmosphere of an inert gas (such as nitrogen, helium, neon, or argon) at a temperature from 500° C. to 750° C. inclusive (or a temperature lower than or equal to the strain point of the glass substrate) for approximately 1 minute to 10 minutes inclusive, preferably at 650° C. for approximately 3 minutes to 6 minutes inclusive. Note that the dew point of the inert gas is lower than or equal to −50° C., more preferably, lower than or equal to −60° C. Since dehydration or dehydrogenation can be performed in a short time with the RTA method, the throughput is high and the shrinkage can be small even if the first heat treatment is performed even at a temperature over the strain point of a glass substrate. Note that the timing of heat treatment for the dehydration or dehydrogenation is not limited to this timing and may be performed plural times, for example, before and after a photolithography step or a film formation process.

Note that in this specification, heat treatment in the atmosphere of an inert gas such as nitrogen or a rare gas is referred to as heat treatment for dehydration or dehydrogenation. In this specification, for convenience, dehydration or dehydrogenation refers not only to elimination of $H_2$ by heat treatment but also to elimination of H, OH, or the like.

It is important that the oxide semiconductor layer which has been subjected to dehydration or dehydrogenation should not be exposed to the air so that entry of water or hydrogen into the oxide semiconductor layer can be prevented. In a transistor using an oxide semiconductor layer which is obtained in such a manner that an i-type oxide semiconductor layer is changed into an n-type (e.g., $n^-$-type or $n^+$-type) oxide semiconductor layer, i.e. a low-resistant oxide semiconductor layer, by dehydration or dehydrogenation and then the n-type oxide semiconductor layer is changed into an i-type oxide semiconductor layer again so as to have high resistance, the threshold voltage of the transistor can be positive voltage, so that the transistor shows so-called normally-off characteristics. It is preferable that a transistor used for a display device be formed with a positive threshold voltage which is as close to 0 V as possible. In an active matrix display device, the electric characteristics of a transistor included in a circuit are important and influence the performance of the display device. The threshold voltage of the transistor is particularly important. Note that if the threshold voltage of the transistor is negative, the transistor shows so-called normally-on characteristics; in other words, current flows between a source electrode and a drain electrode even when the gate voltage is 0 V. Accordingly, it is difficult to control the circuit including the transistor. Even when the transistor has positive threshold voltage, the transistor cannot perform a switching operation itself because the driving voltage is insufficient in the case where the absolute value of the threshold voltage is large. In the case of an n-channel transistor, it is preferable that a channel be formed and drain current begins to flow after the positive voltage is applied as a gate voltage. A transistor in which a channel is not formed unless the driving voltage is high and a transistor in which a channel is formed and then a drain current flows even when a negative voltage is applied are not suitable as the transistor used for a circuit.

In cooling from the temperature at which dehydration or dehydrogenation is performed, an atmosphere may be switched to a different atmosphere from the atmosphere where a temperature is raised or heat treatment is performed. For example, cooling can be performed in the furnace where dehydration or dehydrogenation is performed while the furnace is filled with a high-purity oxygen gas, a high-purity $N_2O$ gas, or dry air (having a dew point of lower than or equal to −50° C., preferably lower than or equal to −60° C.) without exposure to the air.

Note that in the first heat treatment, it is preferable that water, hydrogen, and the like be not contained in nitrogen or a rare gas such as helium, neon, or argon. Here, it is preferable that nitrogen or a rare gas such as helium, neon, or argon introduced into a heat treatment apparatus have purity of 6N (99.9999%) or more, preferably, 7N (99.99999%) or more.

In the case where heat treatment is performed under an atmosphere of an inert gas, an oxide semiconductor layer is changed into an oxygen-deficient oxide semiconductor layer by the heat treatment to be an n-type (e.g., $n^-$-type) oxide semiconductor layer, i.e. a low-resistant oxide semiconductor layer. Then, the oxide semiconductor layer is placed in an oxygen-excess state by formation of an oxide insulating layer which is in contact with the oxide semiconductor layer so as to be a high-resistance oxide semiconductor layer, i.e. an i-type oxide semiconductor layer. Accordingly, it is possible to manufacture a transistor having favorable electric characteristics and high reliability.

When the oxide semiconductor layer which is not subjected to heat treatment by Thermal Desorption Spectroscopy (TDS) is analyzed, two peaks in spectra which show desorption of moisture are observed at a temperature up to 450° C. On the other hand, in the oxide semiconductor layer which is sufficiently dehydrated or dehydrogenated under the above conditions, at a least a peak at around 250° C. to 300° C. of two peaks in spectra is not detected.

In this embodiment, a heat treatment apparatus including the third chamber described in Embodiment 1 is used for the RTA treatment. Heat treatment is performed on the oxide semiconductor layer in a nitrogen atmosphere at 650° C. for 6 minutes, and then rapid cooling is performed in the third chamber which is controlled to be the same nitrogen atmosphere with the oxide semiconductor layer not exposed to the air. Note that without limitation to a nitrogen atmosphere, dehydration or dehydrogenation may be performed in a helium or argon atmosphere.

The oxide semiconductor layer 404 is partly crystallized in some cases, depending on a condition of the first heat treatment or a material of the oxide semiconductor layer 404. After the first heat treatment, the oxide semiconductor layer 404 which is changed into an oxygen-deficient oxide semiconductor layer to be a low-resistant oxide semiconductor layer is obtained (see FIG. 5B). The carrier concentration of the oxide semiconductor layer is higher after the first heat treatment than that of the oxide semiconductor film just after the film formation, accordingly; the oxide semiconductor layer 404 have a carrier concentration of $1 \times 10^{18}/cm^3$ or more. Note that the oxide semiconductor layer is preferably amorphous but may be partly crystallized. Note that in this specification, even in the state where the oxide semiconductor layer is partly crystallized, it is referred to as an "amorphous" state.

Further, the gate electrode layer 421a is crystallized to be a microcrystalline film or a polycrystalline film in some cases, depending on a condition of the first heat treatment or a material of the gate electrode layer 421a. For example, in the case where a film of an indium tin oxide film is used as the gate electrode layer 421a, the film is crystallized by the first heat treatment at 450° C. for 1 hour.

The first heat treatment may be performed on the oxide semiconductor layer before it is processed into the island-shaped oxide semiconductor layers.

Next, an oxide insulating layer is formed over the gate insulating layer 402 and the oxide semiconductor layer 404 by a sputtering method. Then, a resist mask is formed in a third photolithography step, and the oxide insulating layers 426 are formed by selective etching. After that, a step of removing the resist mask may be performed. At this phase, the regions are formed that overlap with the oxide insulating layers 426 which cover the peripheral portion and side surface of the oxide semiconductor layer (the first region 444c and the second region 444d of the oxide semiconductor layer), whereby leakage current and parasitic capacitance can be reduced (see FIG. 5C). Note that the oxide insulating layers 426 is not necessarily formed.

Next, a metal film is stacked over the gate insulating layer 402, the oxide insulating layers 426, and the oxide semiconductor layer 404.

As a material of the metal film, an element selected from Ti, Mo, W, Al, Cr, Cu, and Ta, an alloy containing any of the above elements as a component, or the like is used. The above metal film is not limited to a single layer and a stacked layer of different films can be used. In this embodiment, a three-layer-stacked film in which a molybdenum film, an aluminum film, and a molybdenum film are stacked is used.

Next, a resist mask is formed in a fourth photolithography step, and the metal film is selectively etched to form the source electrode layer 445a and the drain electrode layer 445b. After that, the resist mask is removed (see FIG. 5D).

Next, an insulating layer 427 is formed over the oxide insulating layer 426, the source electrode layer 445a, the drain electrode layer 445b and the oxide semiconductor layer 404 (see FIG. 5E). As the insulating layer 427, a silicon oxide film, a silicon nitride oxide film, an aluminum oxide film, an aluminum oxynitride film, or the like is used. In this embodiment, a silicon oxide film formed by an RF sputtering method is used as the insulating layer 427.

The oxide insulating layer 426 can be formed with a thickness of at least 1 nm with a method with which impurities such as water or hydrogen are not mixed into the above oxide insulating layer, as appropriate. In this embodiment, the oxide insulating layer 426 is formed using a silicon oxide film which is formed with a sputtering method. The substrate temperature in film formation may be higher than or equal to room temperature and lower than or equal to 300° C. and in this embodiment, is 100° C. In order to prevent entry of an impurity such as water or hydrogen in the film formation, it is preferable to perform pre-baking under reduced pressure at a temperature of 150° C. to 350° C. inclusive for 2 minutes to 10 minutes inclusive before the film formation, to form an oxide insulating layer without exposure to the air. The formation of the silicon oxide film with a sputtering method can be performed in an atmosphere of a rare gas (typically, argon) or an oxygen atmosphere, or a mixed atmosphere containing a rare gas (typically argon) and oxygen. Moreover, a silicon oxide target or a silicon target can be used as a film formation target. For example, with the use of a silicon target, a silicon oxide film can be formed with a sputtering method under an atmosphere of oxygen and a rare gas. The oxide insulating layer formed in contact with the oxide semiconductor layer whose resistance is reduced is formed using an inorganic insulating film that does not contain impurities such as moisture, a hydrogen ion, and OFF and blocks entry of such impurities from the outside. Typically, a silicon oxide film, a silicon nitride oxide film, an aluminum oxide film, an aluminum oxynitride film, or the like is used.

Next, second heat treatment is performed under an atmosphere of an inert gas such as nitrogen at a temperature of higher than or equal to 200° C. and lower than or equal to 400° C., preferably, higher than or equal to 250° C. and lower than or equal to 350° C. For example, heat treatment is performed under a nitrogen atmosphere at 250° C. for 1 hour. Alternatively, RTA treatment may be performed at high temperature for a short time as in the first heat treatment.

In the second heat treatment, heating is performed in such a condition that part of the insulating layer 427 that is an oxide and the oxide semiconductor layer 404 are in contact with each other. Therefore, the oxide semiconductor layer 404, the resistance of which has been reduced through the first heat treatment, is supplied with oxygen from the insulating layer 427 to be in an oxygen-excess state, whereby the oxide semiconductor layer 404 has high resistance (i-type conductivity).

Note that although the second heat treatment is performed just after the formation of the silicon oxide film in this embodiment, the heat treatment of the present invention is not limited to this timing. The second heat treatment may be performed at any time after the formation of the silicon oxide film. Note that the timing of heat treatment is not limited to this timing and may be performed plural times, for example, before and after a photolithography step or a film formation process.

In the case where the source electrode layer 425a and the drain electrode layer 425b are formed using a heat-resistant material, a step in which the conditions of the first heat treatment are used can be performed at the timing of the second heat treatment.

Then, the protective insulating layer 428 is formed over the insulating layer 427 (see FIG. 5E). The protective insulating layer 428 is formed using a silicon nitride film, a silicon nitride oxide film, an aluminum nitride film, or the like. In this embodiment, a silicon nitride film is formed as the protective insulating layer 428 with an RF sputtering method.

Through the above-described steps, a transistor using the oxide semiconductor layer in a channel formation region and having favorable electric characteristics and high reliability can be manufactured.

Note that this embodiment can be freely combined with any of the other embodiments.

Embodiment 3

In this embodiment will be described an example of a bottom contact transistor and a manufacturing process thereof, which is different from that of Embodiment 2, with reference to FIGS. 6A to 6E. FIGS. 6A to 6E are the same as FIGS. 5A to 5E except that there is a difference in part of the process. Therefore, the same portions are denoted by the same reference numerals, and detailed description of the same portions is omitted.

Figure 6A:
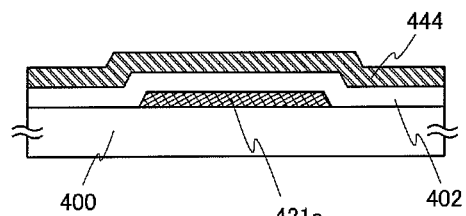
FIGS. 6A to 6E are process cross-sectional views of a semiconductor device of an embodiment of the present invention.
Figure 6B:
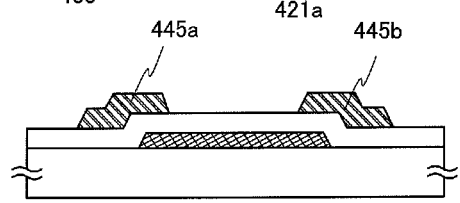
Figure 6C:
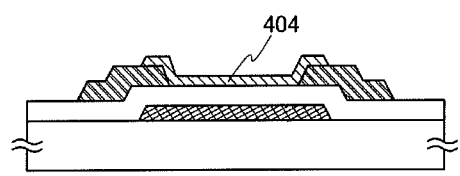
Figure 6D:
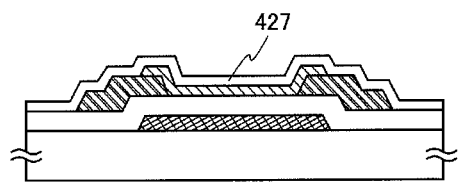
Figure 6E:
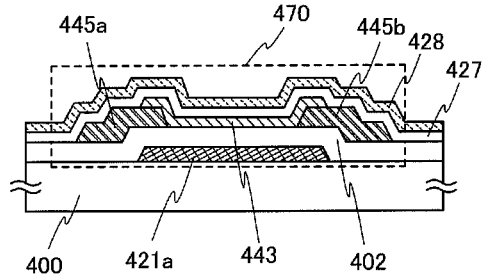

A transistor 470 illustrated in FIG. 6E is a bottom gate structure which is referred to as a bottom contact type.

The transistor 470 includes, over the substrate 400 having an insulating surface, the gate electrode layer 421a, the gate insulating layer 402, the source electrode layer 445a, the drain electrode layer 445b, the oxide semiconductor layer including the channel formation region 443, the insulating layer 427, and the protective insulating layer 428.

A process of manufacturing the transistor 470 is described below with reference to FIGS. 6A to 6E.

The gate electrode layer 421a and the gate insulating layer 402 are formed in accordance with Embodiment 2.

Next, a metal film 444 is formed over the gate insulating layer 402 (see FIG. 6A). In this embodiment, a three-layer-stacked film in which a molybdenum film, an aluminum film, and a molybdenum film are stacked is used.

Next, a resist mask is formed in a photolithography step, and the metal film 444 is selectively etched to form the source electrode layer 445a, and the drain electrode layer 445b (see FIG. 6B).

Next, an oxide semiconductor film is formed in a manner similar to that of Embodiment 2, and the oxide semiconductor layer 404 is formed through a photolithography step and an etching step (see FIG. 6C).

Here, the oxide semiconductor layer is dehydrated or dehydrogenated in accordance with the method of the first heat treatment described in Embodiment 2.

Note that before the oxide semiconductor film is formed, heat treatment (at higher than or equal to 400° C. and lower than the strain point of the substrate) may be performed under an atmosphere of an inert gas (e.g., nitrogen, helium, neon, or argon) so that impurities such as hydrogen and water, which are included in the gate insulating layer 402, are removed.

Next, the insulating layer 427 is formed over the source electrode layer 445a, the drain electrode layer 445b, and the oxide semiconductor layer 404 (see FIG. 6D). As the insulating layer 427, a silicon oxide film, a silicon nitride oxide film, an aluminum oxide film, an aluminum oxynitride film, or the like is used. In this embodiment, a silicon oxide film is formed as the insulating layer 427 with an RF sputtering method.

Here, heat treatment is performed in accordance with the method of the second heat treatment described in Embodiment 2.

Although the second heat treatment is performed after the formation of the silicon oxide film in this embodiment, the second heat treatment can be performed any time after the formation of the silicon oxide film and the timing of the second heat treatment is not limited to just after the formation of the silicon oxide film.

In addition, in the case where the source electrode layer 445a and the drain electrode layer 445b are formed using a heat-resistant material, a step in which the conditions of the first heat treatment are used can be performed at the timing of the second heat treatment.

Then, the protective insulating layer 428 is formed over the insulating layer 427 (see FIG. 6E). The protective insulating layer 428 is formed using a silicon nitride film, a silicon nitride oxide film, an aluminum nitride film, or the like. In this embodiment, the protective insulating layer 428 is formed with an RF sputtering method.

Through the above-described steps, a transistor using the oxide semiconductor layer in a channel formation region and having favorable electric characteristics and high reliability can be manufactured.

Note that this embodiment can be freely combined with any of the other embodiments.

Embodiment 4

In this embodiment will be described an example in which an active matrix liquid crystal display device or light-emitting device is manufactured over one substrate using the transistor described in any of Embodiment 2.

Figure 7:
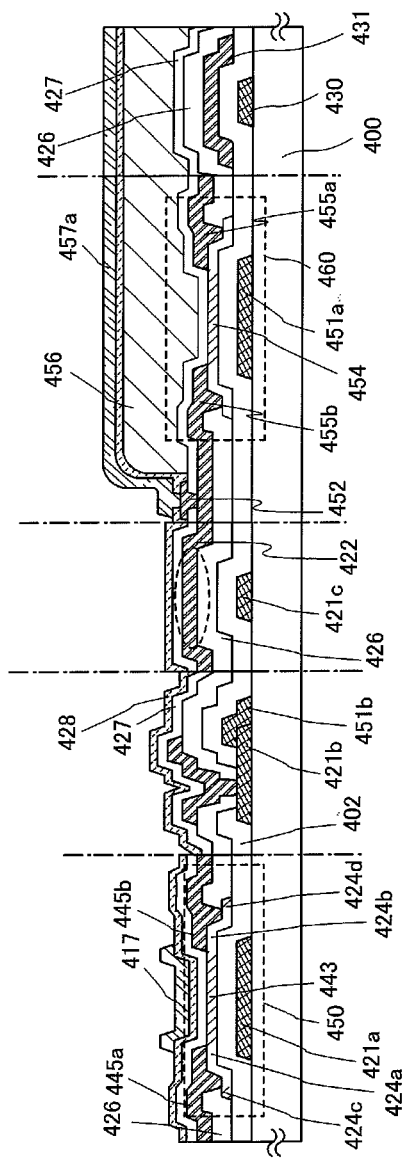
FIG. 7 is a cross-sectional view illustrating a semiconductor device.

FIG. 7 illustrates an example of a cross-sectional structure of a liquid crystal display device using an active matrix substrate.

While in Embodiment 2, modes of a transistor are illustrated in the cross-sectional views, in this embodiment, a structure in which a driver circuit portion and a pixel portion are included over one substrate is described with a view illustrating the following: a transistor 450 for the driver circuit portion; a transistor 460 for the pixel portion; a gate wiring contact portion; a storage capacitor; an intersection of a gate wiring and a source wiring; a pixel electrode; and the like. The storage capacitor, the gate wiring, and the source wiring can be formed in the same manufacturing steps as the transistor shown in Embodiment 2 and can be manufactured without an increase in the number of photomasks and an increase in the number of steps.

In FIG. 7, the transistor 450 is a transistor provided in the driver circuit portion and the transistor 460 electrically connected to a pixel electrode layer 457a is a transistor provided in the pixel portion.

In this embodiment, the transistor 460 formed over the substrate 400 has the same structure as the transistors in Embodiment 2. Here, a channel-etched transistor is shown as an example.

A capacitor wiring layer 430 which is formed using the same material in the same step as a gate electrode layer of the transistor 460 overlaps with a capacitor electrode layer 431, with a gate insulating layer 402 serving as a dielectric material interposed therebetween; thus, a storage capacitor is formed. Note that the capacitor electrode layer 431 is formed using the same material in the same step as a source electrode layer or a drain electrode layer of the transistor 460.

Note that the storage capacitor is provided below the pixel electrode layer 457a. Although not illustrated, the capacitor electrode layer 431 is electrically connected to the pixel electrode layer 457a.

This embodiment shows the example in which the storage capacitor is formed using the capacitor electrode layer 431 and the capacitor wiring layer 430; however, there is no particular limitation on the structure of the storage capacitor.

For example, the storage capacitor may be formed by stacking a gate wiring, a planarization insulating layer, a protective insulating layer, a gate insulating layer, and the pixel electrode layer 457a.

A plurality of gate wirings, source wirings, and capacitor wiring layers are provided in accordance with the pixel density. In a terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. The number of each of the terminals to be provided may be any number, and the number of each terminal may be determined as appropriate.

In the gate wiring contact portion, a gate electrode layer 421b can be formed using a low resistance metal material. The gate electrode layer 421b is electrically connected to the gate wiring through a contact hole that reaches the gate wiring.

A gate electrode layer of the transistor 450 in the driver circuit portion may be electrically connected to a conductive layer 417 provided above the oxide semiconductor layer.

Further, in the wiring intersection, in order to reduce the parasitic capacitance, the gate insulating layer 402 and the oxide insulating layer 426 are stacked between a gate wiring layer 421c and a source wiring layer 422.

When an active matrix liquid crystal display device is manufactured, an active matrix substrate and a counter substrate provided with a counter electrode are fixed with a liquid crystal layer interposed therebetween. Similarly, with a plurality of microcapsules each including first particles having a positive charge and second particles having a negative charge disposed between two electrodes, an active matrix electrophoretic display device can be manufactured. A common electrode electrically connected to the counter electrode on the counter substrate is provided over the active matrix substrate and a fourth terminal electrode electrically connected to the common electrode is provided in the terminal portion. The fourth terminal electrode is used for setting the common electrode to a fixed potential such as GND or 0 V. The fourth terminal electrode can be formed using the same material as the pixel electrode layer 457a.

When the same material is used for the gate electrode, the source electrode, the drain electrode, the pixel electrode, another electrode layer, and another wiring layer, a common raw material and a common manufacturing apparatus can be used, and thus manufacturing costs can be reduced.

When a photosensitive resin material is used for a planarization insulating layer 456 in the structure of FIG. 7, the step for forming a resist mask can be omitted.

Figure 8:
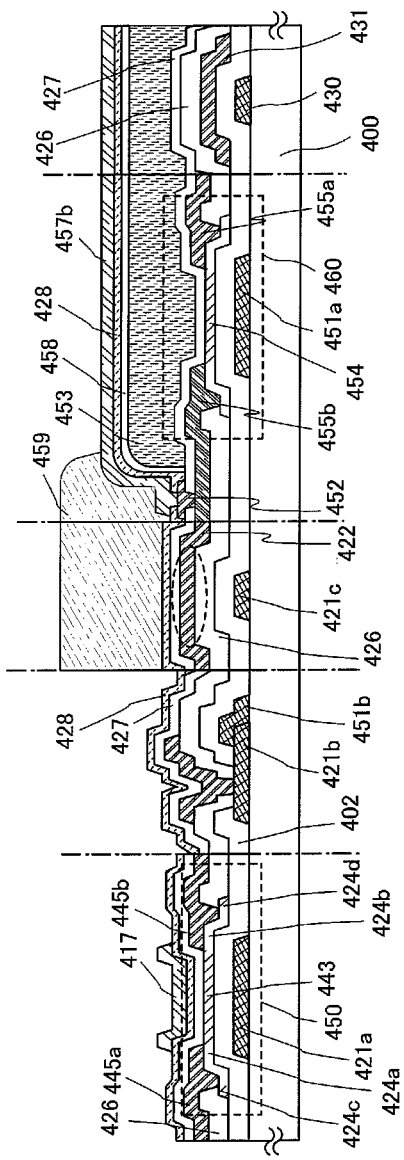
FIG. 8 is a cross-sectional view illustrating a semiconductor device.

In addition, FIG. 8 illustrates a cross-sectional view in a state of a substrate of an active matrix light-emitting device before an EL layer is formed over a first electrode (a pixel electrode).

In FIG. 8, a channel-etched transistor is illustrated; however, the transistor having a structure similar to that described in Embodiment 3 can also be used. Moreover, the active matrix light-emitting device illustrated in FIG. 8 can have a structure similar to that of the above liquid crystal display device except for the structure of a pixel portion which will be shown below.

After an insulating layer 427 is formed, a color filter layer 453 is formed. The colors of the color filter layer are red, green, and blue. The color filter layers are sequentially formed in the specific positions with a printing method, an ink-jet method, an etching method using a photolithography technique, or the like. By providing the color filter layer 453 on the substrate 400 side, alignment of the color filter layer 453 and a light-emitting region of a light-emitting element can be performed without depending on the alignment accuracy of the sealing substrate.

Next, an overcoat layer 458 which covers the color filter layer 453 is formed. The overcoat layer 458 is formed using a light-transmitting resin.

Here, an example in which full-color display is performed using color filter layers of three colors of red, green, and blue; however, the color display is not particularly limited thereto. A color of cyan, magenta, yellow, or white may be used.

Next, a protective insulating layer 428 which covers the overcoat layer 458 and the insulating layer 427 is formed. For the protective insulating layer 428, an inorganic insulating film such as a silicon nitride film, an aluminum nitride film, a silicon nitride oxide film, or an aluminum oxynitride film is used.

Next, by a photolithography step and an etching step, a contact hole reaching the connection electrode layer 452 is formed in the protective insulating layer 428 and the insulating layer 427. In addition, by this photolithography step and an etching step, the protective insulating layer 428 and the insulating layer 427 in a terminal portion are selectively etched to expose part of a terminal electrode. Further, in order to connect a second electrode of a light-emitting element formed later to a common potential line, a contact hole reaching the common potential line is also formed.

Next, a light-transmitting conductive film is formed and a photolithography step and an etching step are performed, so that a first electrode 457b which is electrically connected to the connection electrode layer 452 is formed.

Next, a partition wall 459 is formed to cover the periphery of the first electrode 457b. The partition wall 459 is formed using an organic resin film of polyimide, acrylic, polyamide, epoxy, or the like, an inorganic insulating film, or organic polysiloxane. The partition wall 459 can be formed using an organic insulating material or an inorganic insulating material. It is preferable that the partition wall 459 be formed to have an opening over the first electrode 457b so that a sidewall is formed as an inclined surface with curvature. Such an opening can be easily formed using a photosensitive resin material.

Through the steps described above, the state of the substrate illustrated in FIG. 8 can be obtained. Further, an EL layer is formed over the first electrode 457b and the second electrode is formed over the EL layer, whereby a light-emitting element is formed. The second electrode is electrically connected to the common potential line.

The conductive layer 417 may be provided over the oxide semiconductor layer of the transistor 450 of the driver circuit portion in each of FIG. 7 and FIG. 8. The conductive layer 417 can be formed using the same material in the same step as the pixel electrode layer 457a or the first electrode 457b.

The conductive layer 417 is provided so as to overlap with the channel formation region 443 of the oxide semiconductor layer, whereby the amount of change over time in threshold voltage of the transistor 450 can be reduced. The conductive layer 417 has a potential which is the same as that of the gate electrode layer 421a, and can function as a second gate electrode layer. In addition, the conductive layer 417 may have a potential which is different from that of the gate electrode layer 421a. Alternatively, the potential of the conductive layer 417 may be GND or 0 V, or the conductive layer 417 may be in a floating state.

Since the transistor is easily broken due to static electricity or the like, a protective circuit is preferably provided over the same substrate as the pixel portion or the driver circuit portion. The protective circuit is preferably formed with a non-linear element including an oxide semiconductor layer. For example, protective circuits are provided between the pixel portion and each of a scan-line input terminal and a signal-line input terminal. In this embodiment, a plurality of protective circuits are provided so as to prevent breakage of a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed through the same step as the transistor 460 in the pixel portion, and can be made to have the same characteristics as a diode by connecting a gate terminal to a drain terminal of the non-linear element, for example.

Note that this embodiment can be freely combined with any of the other embodiments.

Embodiment 5

A semiconductor device having a display function (also referred to as a display device) can be manufactured using the transistor described in any of Embodiments 2 and 3. Moreover, a driver circuit portion and a pixel portion, which each include the transistor, can be formed over one substrate, whereby a system-on-panel can be obtained.

A display device includes a display element. Further, a display medium whose contrast is changed by an electric effect, such as a liquid crystal element (also referred to as a liquid crystal display element) or an electronic ink, can be used.

Note that a display device in this specification means an image display device, a display device, or a light source (including a lighting device). Further, the "display device" includes the following modules in its category: a module including a flexible printed circuit (FPC) or a tape automated bonding (TAB) tape; a module having a TAB tape which is provided with a printed wiring board at the end thereof; and a module having an integrated circuit (IC) which is directly mounted on a display element with a chip on glass (COG) method.

The appearance and a cross section of a liquid crystal display panel, which is an embodiment of a display device, will be described with reference to FIGS. 9A1, 9A2, and 9B. FIGS. 9A1 and 9A2 are each a plan view of a panel in which transistors 4010 and 4011 and a liquid crystal element 4013 are sealed between a first substrate 4001 and a second substrate 4006 with a sealant 4005 interposed therebetween. FIG. 9B is a cross-sectional view taken along line M-N in FIGS. 9A1 and 9A2.

The sealant 4005 is provided so as to surround a pixel portion 4002 and a scan-line driver circuit 4004 which are provided over the first substrate 4001. The second substrate 4006 is provided over the pixel portion 4002 and the scan-line driver circuit 4004. Therefore, the pixel portion 4002 and the scan-line driver circuit 4004 are sealed together with a liquid crystal layer 4008, by the first substrate 4001, the sealant 4005, and the second substrate 4006. Further, a signal-line driver circuit 4003 which is formed using a single crystal semiconductor or a polycrystalline semiconductor is mounted in a region different from the region surrounded by the sealant 4005 over the first substrate 4001.

Note that there is no particular limitation on the connection method of the signal-line driver circuit 4003, and a COG method, a wire bonding method, a TAB method, or the like can be used. FIG. 9A1 illustrates an example in which the signal-line driver circuit 4003 is mounted with a COG method, and FIG. 9A2 illustrates an example in which the signal-line driver circuit 4003 is mounted with a TAB method.

Each of the pixel portion 4002 and the scan-line driver circuit 4004 which are provided over the first substrate 4001 includes a plurality of transistors. In FIG. 9B, the transistor 4010 included in the pixel portion 4002 and the transistor 4011 included in the scan-line driver circuit 4004 are illustrated as an example. Insulating layers 4041, 4020, and 4021 are provided over the transistors 4010 and 4011.

Any of the highly reliable transistors each including an oxide semiconductor layer, which are described in any of Embodiments 2, and 3 can be used as the transistors 4010 and 4011. In this embodiment, the transistors 4010 and 4011 are n-channel transistors.

A conductive layer 4040 is provided over the insulating layer 4021 so as to overlap with a channel formation region of an oxide semiconductor layer in the transistor 4011 for the driver circuit portion. The conductive layer 4040 is provided so as to overlap with the channel formation region of the oxide semiconductor layer, whereby the amount of change over time in threshold voltage of the transistor 4011 can be reduced. Further, a potential of the conductive layer 4040 may be the same as or different from that of the gate electrode of the transistor 4011. The conductive layer 4040 can function also as a second gate electrode layer. Alternatively, the potential of the conductive layer 4040 may be GND or 0 V, or the conductive layer 4040 may be in a floating state.

A pixel electrode 4030 included in the liquid crystal element 4013 is electrically connected to the transistor 4010. A counter electrode 4031 of the liquid crystal element 4013 is formed over the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are provided with an insulating layer 4032 and an insulating layer 4033 which each function as an alignment film, respectively.

Note that a light-transmitting substrate such as glass, ceramics, or plastics can be used as the first substrate 4001 and the second substrate 4006. As plastic, a fiberglass-reinforced plastics (FRP) plate, a polyvinyl fluoride (PVF) film, a polyester film, or an acrylic resin film can be used.

A columnar spacer denoted by reference numeral 4035 is obtained by selective etching of an insulating layer and is provided in order to control the distance (a cell gap) between the pixel electrode 4030 and the counter electrode 4031. Note that a spherical spacer may be used. The counter electrode 4031 is electrically connected to a common potential line formed over the same substrate as the transistor 4010. The counter electrode 4031 and the common potential line can be electrically connected to each other through conductive particles arranged between the pair of substrates, using a common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent has a short response time of 1 msec or less, has optical isotropy, which makes the alignment process unneeded, and has a small viewing angle dependence.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process.

In the transistor 4011, the insulating layer 4041 is formed in contact with the semiconductor layer including the channel formation region. The insulating layer 4041 can be formed using a material and a method which are similar to those of the insulating layer 427 described in Embodiment 2. In order to reduce the surface roughness by the transistor, the transistors are covered with the insulating layer 4021 which functions as a planarizing insulating layer. Here, a silicon oxide film is formed as the insulating layer 4041 with a sputtering method in a manner similar to that of Embodiment 2.

A protective insulating layer 4020 is formed over the insulating layer 4041. The protective insulating layer 4020 can be formed using a material and a method which are similar to those of the protective insulating layer 428 described in Embodiment 2. Here, a silicon nitride film is formed as the protective insulating layer 4020 with a PCVD method.

The insulating layer 4021 is formed as the planarizing insulating layer. The insulating layer 4021 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

The insulating layer 4021 can be formed, depending on the material, with a method such as a sputtering method, an SOG method, a spin coating method, a dipping method, a spray coating method, a droplet discharge method (e.g., an ink-jet method, screen printing, or offset printing), or a tool such as a doctor knife, a roll coater, a curtain coater, or a knife coater. The step of baking the insulating layer 4021 serves also as the annealing step of the semiconductor layer, whereby the semiconductor device can be efficiently manufactured.

The pixel electrode 4030 and the counter electrode 4031 can be formed using a light-transmitting conductive material such as indium oxide containing tungsten, indium zinc oxide containing tungsten, indium oxide containing titanium, indium tin oxide containing titanium, indium tin oxide (hereinafter referred to as ITO), indium zinc oxide, or indium tin oxide to which silicon is added.

Alternatively, the pixel electrode 4030 and the counter electrode 4031 can be formed using a conductive composition containing a conductive macromolecule (also referred to as a conductive polymer). It is preferable that the pixel electrode formed using the conductive composition have a sheet resistance of 10,000 Ω/square or less and a light transmittance of 70% or more at a wavelength of 550 nm. Further, the resistivity of the conductive macromolecule included in the conductive composition is preferably less than or equal to 0.1 Ω·cm.

As the conductive macromolecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and a potential are supplied to the signal-line driver circuit 4003 which is formed separately, the scan-line driver circuit 4004, and the pixel portion 4002 through an FPC 4018.

In addition, a connection terminal electrode 4015 is formed from the same conductive film as the pixel electrode 4030 included in the liquid crystal element 4013, and a terminal electrode 4016 is formed from the same conductive film as the source electrode layers and the drain electrode layers of the transistors 4010 and 4011.

The connection terminal electrode 4015 is electrically connected to a terminal included in the FPC 4018 through an anisotropic conductive film 4019.

Note that FIGS. 9A1, 9A2, and 9B illustrate an example in which the signal-line driver circuit 4003 is formed separately and mounted on the first substrate 4001; however, this embodiment is not limited to this structure. The scan-line driver circuit may be separately formed and then mounted, or only part of the signal-line driver circuit or part of the scan-line driver circuit may be separately formed and then mounted.

Note that this embodiment can be freely combined with any of the other embodiments.

Embodiment 6

Figure 10A:
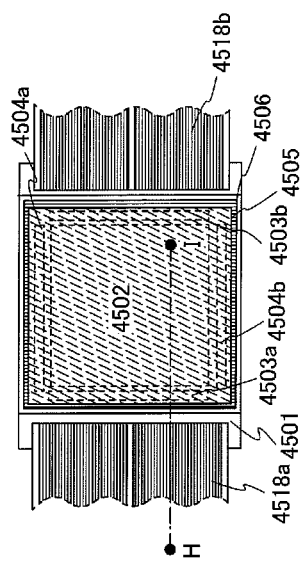
FIG. 10A is a plane view illustrating a semiconductor device and FIG. 10B is a cross-sectional view illustrating a semiconductor device.
Figure 10B:
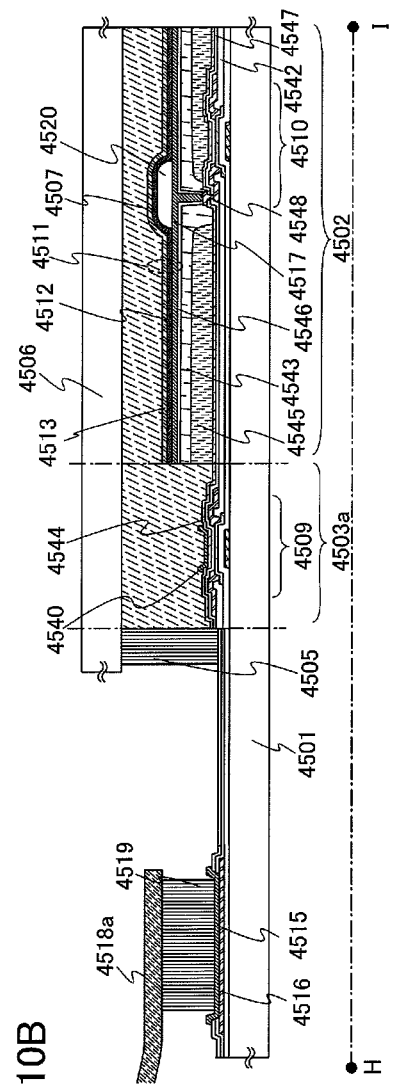

In this embodiment are described the appearance and a cross section of a light-emitting display panel (also referred to as a light-emitting panel), with reference to FIGS. 10A and 10B. FIG. 10A is a plan view of a panel in which a transistor and a light-emitting element formed over a first substrate are sealed between the first substrate and a second substrate with a sealant. FIG. 10B is a cross-sectional view taken along line H-I in FIG. 10A.

A sealant 4505 is provided so as to surround a pixel portion 4502, signal-line driver circuits 4503a and 4503b, and scan-line driver circuits 4504a and 4504b which are provided over a first substrate 4501. In addition, a second substrate 4506 is provided over the pixel portion 4502, the signal line-driver circuits 4503a and 4503b, and the scan-line driver circuits 4504a and 4504b.

Accordingly, the pixel portion 4502, the signal-line driver circuits 4503a and 4503b, and the scan-line driver circuits 4504a and 4504b are sealed together with a filler 4507, by the first substrate 4501, the sealant 4505, and the second substrate 4506. It is preferable that a panel be packaged (sealed) with a protective film (such as a bonding film or an ultraviolet curable resin film) or a cover material with high air-tightness and little degasification so that the panel is not exposed to the outside air, in this manner.

Further, each of the pixel portion 4502, the signal-line driver circuits 4503a and 4503b, and the scan-line driver circuits 4504a and 4504b which are provided over the first substrate 4501 includes a plurality of transistors. In FIG. 10B, a transistor 4510 included in the pixel portion 4502 and a transistor 4509 included in the signal-line driver circuit 4503a are illustrated as an example.

Any of the highly reliable transistors each including an oxide semiconductor layer, which are described in Embodiments 2, or 3, can be used as the transistors 4509 and 4510. In this embodiment, the transistors 4509 and 4510 are n-channel transistors.

A conductive layer 4540 is provided over an insulating layer 4544 so as to overlap with a channel formation region of an oxide semiconductor layer in the transistor 4509 for the driver circuit portion. The conductive layer 4540 is provided so as to overlap with the channel formation region of the oxide semiconductor layer, whereby the amount of change over time in threshold voltage of the transistor 4011 before and after the BT test can be reduced. A potential of the conductive layer 4540 is the same as that of a gate electrode layer of the transistor 4509, whereby the conductive layer 4540 can function as a second gate electrode layer. In addition, the conductive layer 4540 may have a potential which is different from that of the gate electrode layer of the transistor 4509. Alternatively, the potential of the conductive layer 4540 may be GND or 0 V, or the conductive layer 4540 may be in a floating state In the transistor 4509, an oxide insulating layer 4542 which covers a peripheral portion (including a side surface) of the oxide semiconductor layer is formed.

Further, the transistor 4510 is electrically connected to a first electrode 4517 through a connection electrode layer 4548. Further, the oxide insulating layer 4542 which covers a peripheral portion (including a side surface) of the oxide semiconductor layer of the transistor 4510 is formed.

The oxide insulating layer 4542 can be formed using a material and a method which is similar to that of the oxide insulating layer 426 described in Embodiment 2. In addition, the insulating layer 4544 which covers the oxide insulating layer 4542 is formed. The insulating layer 4544 can be formed using a material and a method which are similar to those of the protective insulating layer 428 described in Embodiment 2.

A color filter layer 4545 is formed over the transistor 4510 so as to overlap with a light-emitting region of a light-emitting element 4511.

Further, in order to reduce the surface irregularity caused by the color filter layer 4545, the color filter layer 4545 is covered with an overcoat layer 4543 functioning as a planarization insulating film.

Further, an insulating layer 4546 is formed over the overcoat layer 4543. The insulating layer 4546 can be formed using a material and a method which are similar to those of the protective insulating layer 428 described in Embodiment 2.

The first electrode 4517 which is a pixel electrode included in the light-emitting element 4511 is electrically connected to a source electrode layer or a drain electrode layer of the transistor 4510. Note that the structure of the light-emitting element 4511 is not limited to a stacked structure of the first electrode 4517, an electroluminescent layer 4512, and a second electrode 4513. The structure of the light-emitting element 4511 can be changed as appropriate depending on, for example, the direction in which light is extracted from the light-emitting element 4511.

A partition wall 4520 can be formed using an organic resin film, an inorganic insulating film, or organic polysiloxane. It is preferable that the partition wall 4520 be formed to have an opening over the first electrode 4517 so that a sidewall is formed as an inclined surface with curvature. Such an opening can be easily formed using a photosensitive resin material.

The electroluminescent layer 4512 is not limited to a single layer and may be formed using a plurality of layers stacked.

A protective film may be formed over a second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

Further, a variety of signals and a potential are supplied to the signal-line driver circuits 4503a and 4503b, the scan-line driver circuits 4504a and 4504b, and the pixel portion 4502 through FPCs 4518a and 4518b.

In addition, a connection terminal electrode 4515 is formed from the same conductive film as the first electrode 4517 included in the light-emitting element 4511, and a terminal electrode 4516 is formed from the same conductive film as a source electrode layer and a drain electrode layer of the transistor 4509.

The connection terminal electrode 4515 is electrically connected to a terminal included in the FPC 4518a through an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

As the signal-line driver circuits 4503a and 4503b and the scan-line driver circuits 4504a and 4504b, a driver circuit formed using a single crystal semiconductor or a polycrystalline semiconductor may be mounted. Alternatively, only the signal line-driver circuits or part thereof, or only the scan-line driver circuits or part thereof may be separately formed and mounted. This embodiment is not limited to the structure illustrated in FIGS. 10A and 10B.

Through the above steps, a highly reliable light-emitting display device (display panel) can be manufactured.

Note that this embodiment can be freely combined with any of the other embodiments.

Embodiment 7

A display device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a cellular phone (also referred to as a mobile phone or a cellular phone set), a portable game console, a portable information terminal, an audio reproducing device, a large-sized game machine such as a pachinko machine, and the like.

Figure 11A:
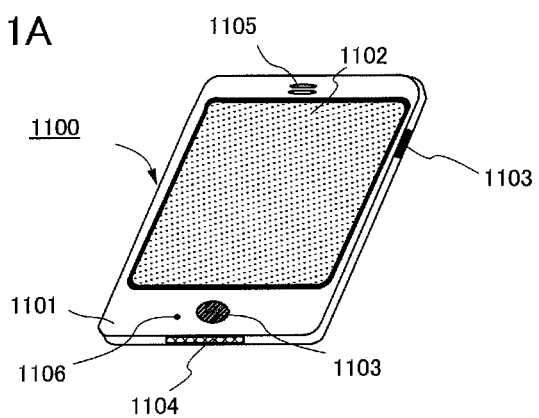
FIGS. 11A and 11B are views each illustrating an electronic device.

FIG. 11A illustrates an example of a cellular phone 1100. The cellular phone 1100 is provided with a display portion 1102 incorporated in a housing 1101, an operation button 1103, an external connection port 1104, a speaker 1105, a microphone 1106, and the like.

When the display portion 1102 of the cellular phone 1100 illustrated in FIG. 11A is touched with a finger or the like, data can be inputted into the cellular phone 1100. Further, operations such as making calls, composing mails, or the like can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode, which is a combination of the two modes, i.e. a combination of the display mode and the input mode.

For example, in the case where a call is made or a mail is composed, a text input mode mainly for inputting text is selected for the display portion 1102 so that text displayed on a screen can be inputted. In that case, it is preferable to display a keyboard or number buttons on almost all area of the screen of the display portion 1102.

When a detection device including a sensor for detecting inclination, such as a gyroscope or an acceleration sensor, is provided inside the cellular phone 1100, display on the screen of the display portion 1102 can be automatically switched by determining the direction of the cellular phone 1100 (whether the cellular phone 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 can also function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

Figure 11B:
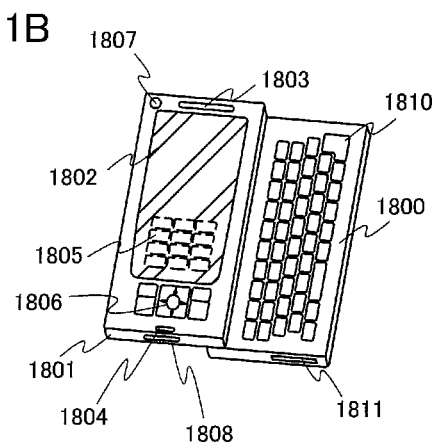

FIG. 11B also illustrates an example of a cellular phone. A portable information terminal whose example is illustrated in FIG. 11B can have a plurality of functions. For example, in addition to a telephone function, such a portable information terminal can have a function of processing a variety of data by incorporating a computer.

The portable information terminal illustrated in FIG. 11B includes two housings, a housing 1800 and a housing 1801. The housing 1800 includes a display panel 1802, a speaker 1803, a microphone 1804, a pointing device 1806, a camera 1807, an external connection terminal 1808, and the like. The housing 1801 includes a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 11B.

Further, in addition to the above structure, a contactless IC chip, a small memory device, or the like may be incorporated.

The display device can be used for the display panel 1802 and the direction of display is changed appropriately depending on an application mode. Further, the display device is provided with the camera 1807 on the same surface as the display panel 1802, and thus it can be used as a videophone. The speaker 1803 and the microphone 1804 can be used for videophone calls, recording, and playing sound, and the like as well as voice calls. Moreover, the housings 1800 and 1801 in a state where they are developed as illustrated in FIG. 11B can shift so that one is lapped over the other by sliding; therefore, the size of the portable information terminal can be reduced, which makes the portable information terminal suitable for being carried.

The external connection terminal 1808 can be connected to various types of cables such as a charging cable and a USB cable, and charging and data communication with a personal computer are possible. Moreover, a storage medium can be inserted into the external memory slot 1811 so that a larger amount of data can be stored and can be moved.

Further, in addition to the above functions, an infrared communication function, a television reception function, or the like may be provided.

Figure 12A:
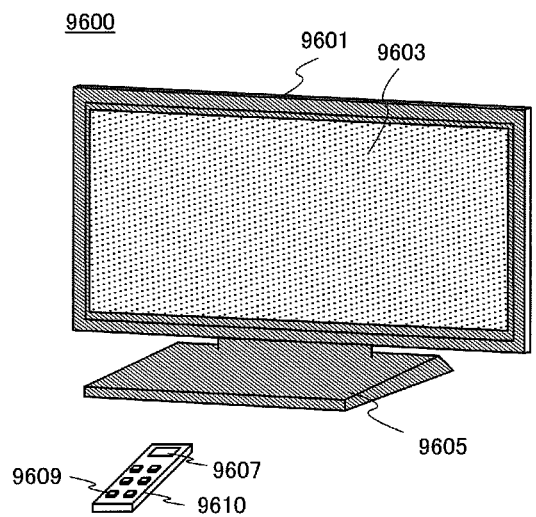
FIGS. 12A and 12B are views each illustrating an electronic device.

FIG. 12A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with operation keys 9609 of the remote controller 9610 so that an image displayed on the display portion 9603 can be controlled. Furthermore, the remote controller 9610 may be provided with a display portion 9607 for displaying data outputted from the remote controller 9610.

Note that the television set 9600 is provided with a receiver, a modem, and the like. With the use of the receiver, general television broadcasting can be received. Moreover, when the television set 9600 is connected to a communication network with or without wires via the modem, one-way (from a sender to a receiver) or two-way (between a sender and a receiver or between receivers) information communication can be performed.

Figure 12B:
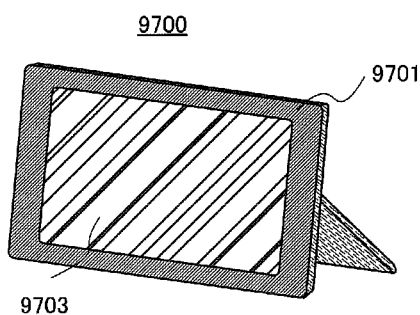

FIG. 12B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal), an external memory slot, and the like. Although these components may be provided on the surface on which the display portion is provided, it is preferable to provide them on the side surface or the back surface for the design of the digital photo frame 9700. For example, a memory storing data of an image taken by a digital camera is inserted in the external memory slot of the digital photo frame, and the image data can be transferred and displayed on the display portion 9703.

The digital photo frame 9700 may be configured to transmit and receive data wirelessly. The structure may be employed in which desired image data is transferred wirelessly and displayed.

Figure 13:
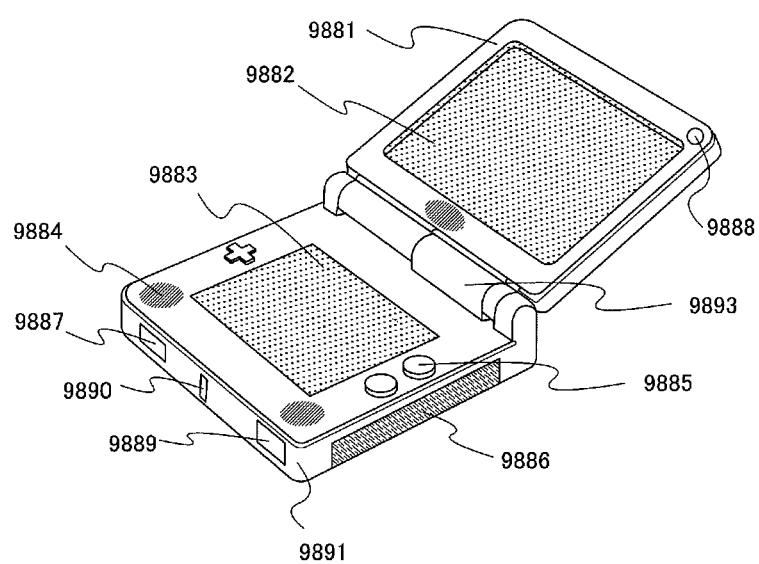
FIG. 13 is a view illustrating an electronic device.

FIG. 13 is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively.

Moreover, the portable game machine illustrated in FIG. 13 is provided with a speaker portion 9884, a recording medium insertion portion 9886, an LED lamp 9890, input means (operation keys 9885, a connection terminal 9887, a sensor 9888 (having a function of measuring force, displacement, position, velocity, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889, and the like. It is needless to say that the structure of the portable amusement machine is not limited to the above and other structures provided with at least a transistor disclosed in this specification can be employed. The portable amusement machine may include other accessory equipment as appropriate. The portable game machine illustrated in FIG. 13 has a function of reading a program or data stored in a recording medium to display it on the display portion, and a function of sharing information with another portable game machine by wireless communication. Note that functions of the portable game machine illustrated in FIG. 13 are not limited to those described above and the portable game machine can have a variety of functions.

As described above, the display device described in other embodiments can be arranged in display panels of a variety of electronic appliances such as the above ones.

Note that this embodiment can be freely combined with any of the other embodiments.

This application is based on Japanese Patent Application serial no. 2009-219305 filed with Japan Patent Office on Sep. 24, 2009, the entire contents of which are hereby incorporated by reference.

What is claimed is:

1. A heat treatment apparatus comprising:
a first chamber of which one side is opened;
a second chamber of which one side is opened;
a device for moving at least one of the first chamber and the second chamber;
a heating device provided in one of the first chamber and the second chamber;
a non-contact-type holding means of a substrate, the non-contact-type holding means of a substrate provided in the other of the first chamber and the second chamber;
a gas introduction port provided in at least one of the first chamber and the second chamber; and
a gas exhaust port provided in at least one of the first chamber and the second chamber;
wherein the open side of the first chamber and the open side of the second chamber face each other, and
wherein the first chamber and the second chamber are configured to be connected to each other while a heat treatment is performed and separated from each other after performing the heat treatment.

2. The heat treatment apparatus according to claim 1, wherein the heating device is selected from one of a resistance heater, a lamp heater, and a unit using a heated gas.

3. The heat treatment apparatus according to claim 1, wherein the gas exhaust port is connected to a gas refining apparatus.

4. The heat treatment apparatus according to claim 1, wherein the non-contact-type holding means of a substrate is a Bernoulli Chuck.

5. A heat treatment apparatus, comprising:
a first chamber of which one side is opened;
a second chamber of which one side is opened;
a device for moving the first chamber and the second chamber;
a heating device provided in one of the first chamber and the second chamber;
a non-contact-type holding means of a substrate, the non-contact-type holding means of a substrate provided in the other of the first chamber and the second chamber;
a gas introduction port;
a gas exhaust port; and
a third chamber in which the first chamber, the second chamber, the device for moving the first chamber and the second chamber, the heating device, the gas introduction port, the gas exhaust port and the non-contact-type holding means of a substrate are installed,
wherein the open side of the first chamber and the open side of the second chamber face each other,
wherein the first chamber and the second chamber are configured to be connected to each other while a heat treatment is performed and separated from each other after performing the heat treatment, and
wherein the third chamber has an opening and closing apparatus.

6. The heat treatment apparatus according to claim 5, wherein the heating device is selected from one of a resistance heater, a lamp heater, and a unit using a heated gas.

7. The heat treatment apparatus according to claim 5, wherein the gas exhaust port is connected to a gas refining apparatus.

8. The heat treatment apparatus according to claim 5, wherein the non-contact-type holding means of a substrate is a Bernoulli Chuck.

9. A heat treatment apparatus comprising:
a first chamber of which one side is opened;
a second chamber of which one side is opened;
a jig for holding an end portion of a substrate, the jig provided between the first chamber and the second chamber;
a device for moving at least one of the first chamber and the second chamber;
a device for moving the jig for holding an end portion of a substrate,
a heating device provided in at least one of the first chamber and the second chamber;
a gas introduction port provided in at least one of the first chamber and the second chamber; and
a gas exhaust port provided in at least one of the first chamber and the second chamber;
wherein the jig for holding an end portion of a substrate is configured to hold the substrate while a heat treatment is performed,
wherein the open side of the first chamber and the open side of the second chamber face each other, and
wherein the first chamber and the second chamber are configured to be connected to each other while the heat treatment is performed and separated from each other after performing the heat treatment.

10. The heat treatment apparatus according to claim 9, wherein the heating device is selected from one of a resistance heater, a lamp heater, and a unit using a heated gas.

11. The heat treatment apparatus according to claim 9, wherein the gas exhaust port is connected to a gas refining apparatus.

12. The heat treatment apparatus according to claim 9, wherein the jig for holding an end portion of a substrate has a function of holding a plurality of substrates in a stack with intervals.

13. A heat treatment apparatus, comprising:
a first chamber of which one side is opened;
a second chamber of which one side is opened;
a jig for holding an end portion of a substrate, the jig provided between the first chamber and the second chamber;
a device for moving at least one of the first chamber and the second chamber;
a device for moving the jig for holding an end portion of a substrate;
a heating device provided in at least one of the first chamber and the second chamber;
a gas introduction port provided in at least one of the first chamber and the second chamber;
a gas exhaust port provided in at least one of the first chamber and the second chamber; and
a third chamber in which the first chamber, the second chamber, the device for moving at least one of the first chamber and the second chamber, the device for moving the jig for holding an end portion of a substrate, the heating device, the gas introduction port, the gas exhaust port and the jig for holding an end portion of a substrate are installed,
wherein the jig for holding an end portion of a substrate is configured to hold the substrate while a heat treatment is performed,
wherein the open side of the first chamber and the open side of the second chamber face each other,
wherein the first chamber and the second chamber are configured to be connected to each other while the heat treatment is performed and separated from each other after performing the heat treatment, and
wherein the third chamber has an opening and closing apparatus.

14. The heat treatment apparatus according to claim 13, wherein the heating device is selected from one of a resistance heater, a lamp heater, and a unit using a heated gas.

15. The heat treatment apparatus according to claim 13, wherein the gas exhaust port is connected to a gas refining apparatus.

16. The heat treatment apparatus according to claim 13, wherein the jig for holding an end portion of a substrate has a function of holding a plurality of substrates in a stack with intervals.

17. A heat treatment apparatus comprising:
a first chamber of which one side is opened;
a second chamber of which one side is opened;
a contact-type holding means of a substrate provided between the first chamber and the second chamber;
a device for moving at least one of the first chamber and the second chamber;
a heating device provided in at least one of the first chamber and the second chamber;
a gas introduction port provided in at least one of the first chamber and the second chamber; and
a gas exhaust port provided in at least one of the first chamber and the second chamber;
wherein the contact-type holding means of a substrate is configured to hold the substrate during a heat treatment,
wherein the open side of the first chamber and the open side of the second chamber face each other, and
wherein the first chamber and the second chamber are configured to be connected to each other while the heat treatment is performed and separated from each other after performing the heat treatment.

18. The heat treatment apparatus according to claim 17, wherein the heating device is selected from one of a resistance heater, a lamp heater, and a unit using a heated gas.

19. The heat treatment apparatus according to claim 17, wherein the gas exhaust port is connected to a gas refining apparatus.

* * * * *